United States Patent
Nakamura et al.

(10) Patent No.: US 10,778,182 B2
(45) Date of Patent: Sep. 15, 2020

(54) RESONATOR

(71) Applicant: Murata Manufacturing Co., Ltd., Nagaokakyo-shi, Kyoto-fu (JP)

(72) Inventors: Daisuke Nakamura, Nagaokakyo (JP); Toshio Nishimura, Nagaokakyo (JP); Ville Kaajakari, Altadena, CA (US)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 621 days.

(21) Appl. No.: 15/695,505

(22) Filed: Sep. 5, 2017

(65) Prior Publication Data

US 2018/0048284 A1    Feb. 15, 2018

Related U.S. Application Data

(63) Continuation of application No. PCT/JP2016/060269, filed on Mar. 29, 2016.
(Continued)

(30) Foreign Application Priority Data

Mar. 31, 2015  (JP) ................ 2015-073586

(51) Int. Cl.
*H03H 9/05* (2006.01)
*H03H 9/13* (2006.01)
(Continued)

(52) U.S. Cl.
CPC ...... *H03H 9/0595* (2013.01); *H03H 9/02338* (2013.01); *H03H 9/02393* (2013.01);
(Continued)

(58) Field of Classification Search
CPC combination set(s) only.
See application file for complete search history.

(56) References Cited

U.S. PATENT DOCUMENTS 4,350,918 A    9/1982  Sato
4,609,844 A *  9/1986  Nakamura ............ H03H 9/172
                                                310/321
(Continued)

FOREIGN PATENT DOCUMENTS

JP    S55-85119 A    6/1980
JP    H08-186467 A   7/1996
(Continued)

OTHER PUBLICATIONS

International Search Report issued in International Application No. PCT/JP2016/060262, dated Jun. 21, 2016.
(Continued)

*Primary Examiner* — Bryan P Gordon
(74) *Attorney, Agent, or Firm* — Arent Fox LLP

(57) ABSTRACT

A resonator including a vibrating portion with first and second electrodes and a piezoelectric film formed therebetween. Moreover, a frame surrounds the vibrating portion with a pair of holding units opposite to each other and connecting the vibrating portion with the frame. An extended electrode extends from the holder to the holding unit and either the first or second electrode extends to the holding unit, and is connected to the extended electrode. Furthermore, the resonator includes an electrical resistance value per unit area of the extended electrode that is smaller than an electrical resistance value per unit area of the first electrode or the second electrode that extends to the holding unit.

20 Claims, 9 Drawing Sheets

Related U.S. Application Data

(60) Provisional application No. 62/221,331, filed on Sep. 21, 2015.

(51) Int. Cl.
  *H03H 9/17* (2006.01)
  *H03H 9/02* (2006.01)
  *H03H 9/24* (2006.01)
  *H03H 9/10* (2006.01)
  *H03H 9/15* (2006.01)

(52) U.S. Cl.
  CPC .......... *H03H 9/1057* (2013.01); *H03H 9/132* (2013.01); *H03H 9/17* (2013.01); *H03H 9/2452* (2013.01); *H03H 2009/155* (2013.01)

(56) References Cited

U.S. PATENT DOCUMENTS

| | | | |
|---|---|---|---|
| 5,548,180 | A | 8/1996 | Kaida |
| 7,639,105 | B2 | 12/2009 | Ayazi et al. |
| 7,843,284 | B2 | 11/2010 | Ayazi et al. |
| 8,446,078 | B2* | 5/2013 | Bahreyni ............ H03H 9/02338 310/334 |
| 2008/0079344 | A1 | 4/2008 | Zalud |
| 2010/0314969 | A1 | 12/2010 | Gaidarzhy et al. |
| 2011/0204999 | A1 | 8/2011 | Phan Le et al. |
| 2012/0068578 | A1* | 3/2012 | Takahashi ................ H03H 3/02 310/344 |
| 2013/0285676 | A1* | 10/2013 | Rahafrooz ............. G01N 15/10 324/633 |
| 2016/0111627 | A1 | 4/2016 | Hase et al. |
| 2016/0322954 | A1* | 11/2016 | Kaida .................. B81B 3/0086 |

FOREIGN PATENT DOCUMENTS

| | | |
|---|---|---|
| JP | 2003-198300 A | 7/2003 |
| JP | 2009-100196 A | 5/2009 |
| JP | 2010-232943 A | 10/2010 |
| JP | 2012-080166 A | 4/2012 |
| JP | 2012-151651 A | 8/2012 |
| JP | 2014-50067 A | 3/2014 |
| JP | 2014-068098 A | 4/2014 |
| WO | WO 2015/002261 A1 | 1/2015 |

OTHER PUBLICATIONS

International Search Report issued in International Patent Application No. PCT/JP2016/060269, dated Jun. 21, 2016.
Written Opinion of the International Searching Authority issued in International Application No. PCT/JP2016/060262, dated Jun. 21, 2016.
Written Opinion of the International Searching Authority issued in International Patent Application No. PCT/JP2016/060269, dated Jun. 21, 2016.
International Search Report issued for PCT/JP2016/068476, dated Sep. 13, 2016.
Written Opinion of the International Searching Authority issued for PCT/JP2016/068476, dated Sep. 13, 2016.

* cited by examiner

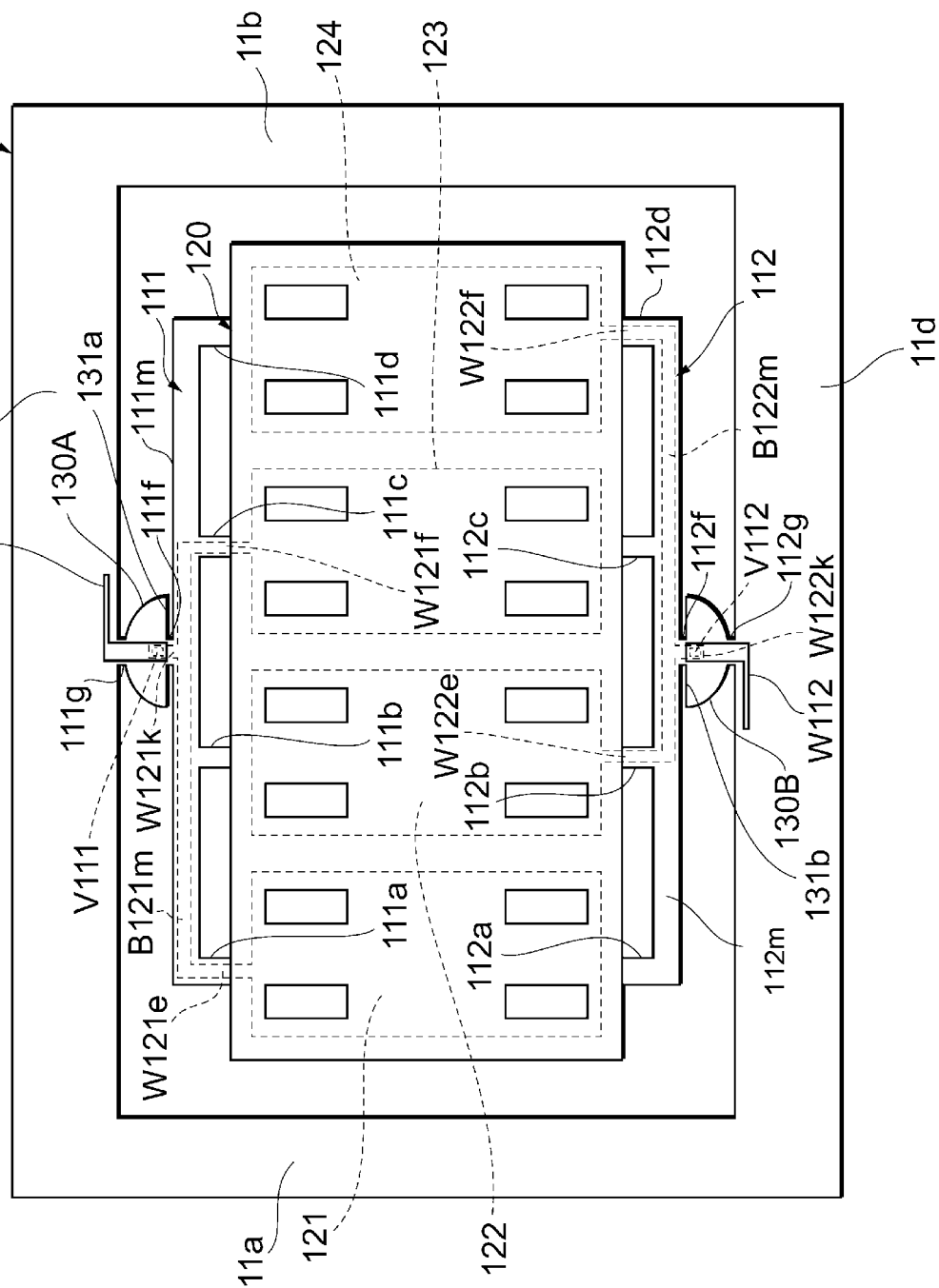

RESONATOR

CROSS REFERENCE TO RELATED APPLICATIONS

The present application is a continuation of PCT/JP2016/060269 filed Mar. 29, 2016, which claims priority to Japanese Patent Application No. 2015-073586, filed Mar. 31, 2015, and U.S. Patent Provisional No. 62/221,331, filed Sep. 21, 2015, the entire contents of each of which are incorporated herein by reference.

TECHNICAL FIELD

The present disclosure relates generally to a resonator.

BACKGROUND

In general, piezoelectric vibrators are used as devices that provide a timepiece function in an electronic apparatus. Moreover, a decrease in size of such piezoelectric vibrators is demanded along with decrease in size of an electronic apparatus. Therefore, resonators manufactured by MEMS (Micro Electro Mechanical Systems) technology are receiving attention.

A convention resonator, for example, is disclosed in Patent Document 1 (identified below) and includes a rectangular vibrating portion, electrodes formed on the vibrating portion in a divided manner, a holding arm that couples the vibrating portion with a holding portion, and a wire that extends an electrode provided on the holding arm to the holding portion.

Patent Document 1: U.S. Pat. No. 7,639,105.

For such designs, the holding arm preferably has a long and narrow shape so as not to interrupt the vibration of the vibrating portion. However, since the resonator of related art like the one disclosed in Patent Document 1 has the long and narrow holding arm, the resonant resistance of the holding arm may increase, which may interrupt the vibration of the vibrating portion.

SUMMARY OF THE INVENTION

The present disclosure is made in the light of the limitations of such conventional designs. Thus, it is an object of the present disclosure to decrease the resonant resistance of a holding unit holding a vibrating portion.

Accordingly, a resonator according to an exemplary aspect includes a vibrating portion including a first electrode, a second electrode, and a piezoelectric film formed between the first electrode and the second electrode. Moreover, a frame surrounds the vibrating portion with a pair of holding units provided opposite to each other and connecting the vibrating portion with the frame. Furthermore, an extended electrode extends from the frame to the holding unit and the first or second electrode extends to the holding unit and is connected to the extended electrode on the holding unit. An electrical resistance value per unit area of the extended electrode is smaller than an electrical resistance value per unit area of the first electrode or the second electrode formed to extend to the holding unit.

With the resonator, the upper electrode of the holding unit is extended by the extended electrode having the smaller electrical resistance value per unit area than that of the upper electrode. Accordingly, the resonant resistance in the holding unit can be decreased.

Preferably, the holding unit may further include a protection film of an insulator on the first electrode or the second electrode formed to extend to the holding unit. The extended electrode may be connected to the first electrode or the second electrode formed to extend to the holding unit through a via penetrating through the protection film.

With this configuration, even a resonator including a protection film for adjusting resonant frequency can connect the extended electrode with an electrode on the holding unit.

Preferably, both the first electrode and the second electrode may be formed to extend to the holding unit. The extended electrode may be connected to the first electrode or the second electrode.

With this configuration, both the upper electrode and the lower electrode can be connected to the extended electrode.

Preferably, the holding unit may include a first arm provided in a direction substantially parallel to a side of the vibrating portion, and a second arm provided in a direction substantially perpendicular to the first arm and connecting the first arm with the vibrating portion. In addition, the extended electrode may be connected to the first electrode or the second electrode through a via at a connection point between the first arm and the second arm.

With this configuration, since the vias are provided at the bending portions of the holding unit, the stiffness and mass of the bending portion can be increased by providing the via at the bending portion of the holding unit. Accordingly, the acoustic reflex effect by the bending portions can be increased, and the confinement of vibration can be further increased.

Preferably, the holding unit may include a vibration absorbing portion having a pair of first arms provided in a direction substantially parallel to a side of the vibrating portion, and a pair of second arms provided in a direction substantially perpendicular to the pair of first arms, both ends of the pair of first arms being connected to both ends of the pair of second arms. Moreover, the extended electrode may be connected to the first electrode or the second electrode through vias at connection points between the first arms and the pair of second arms.

With this configuration, since the vias are provided at both ends of the vibration absorbing portion, the stiffness and mass at both ends of the vibration absorbing portion are increased. Accordingly, the propagation of vibration to the holding unit can be more effectively reduced at the vibration absorbing portion. The vibration of harmonic of the contour vibration propagating from the vibrating portion can be further reliably confined.

According to the exemplary resonators disclosed herein, the resonant resistance in the holding unit holding the vibrating portion can be decreased.

BRIEF DESCRIPTION OF DRAWINGS

FIG. 9 is a plan view schematically illustrating an example structure of a resonator according to a fifth exemplary embodiment.

DETAILED DESCRIPTION OF EXEMPLARY EMBODIMENTS

First Embodiment

Figure 1:
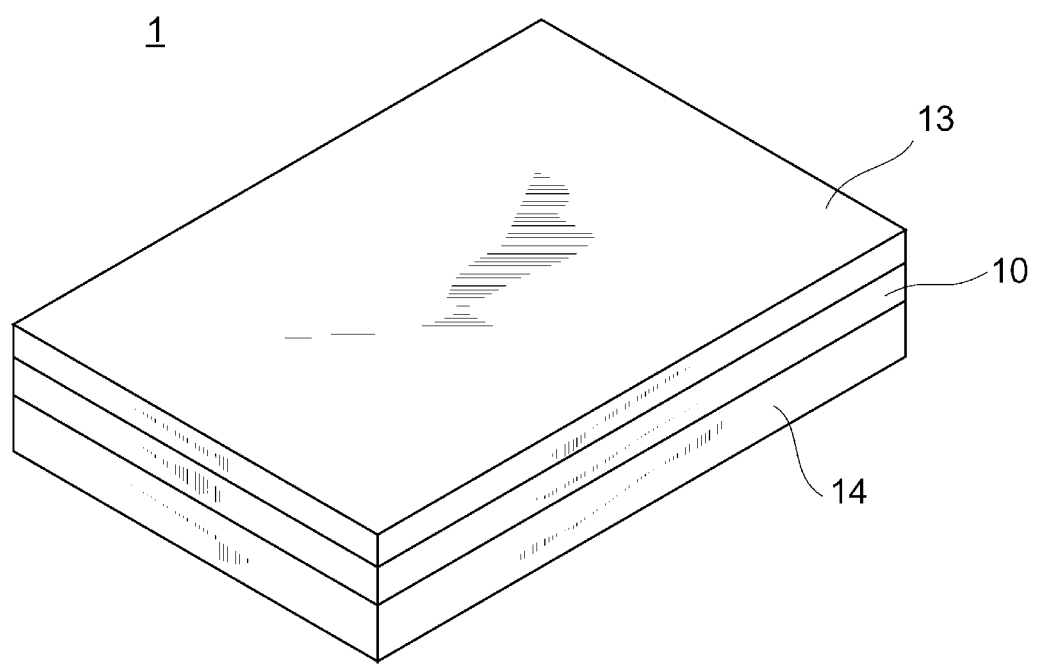
FIG. 1 is a perspective view schematically illustrating the external appearance of a resonator device according to a first exemplary embodiment.

A first exemplary embodiment is described below with reference to the accompanying drawings. FIG. 1 is a perspective view schematically illustrating the external appearance of a resonator device 1 according to the first exemplary embodiment. The resonator device 1 includes a lower substrate 14, an upper substrate 13 that forms a vibration space between the upper substrate 13 and the lower substrate 14, and a resonator 10 sandwiched and held between the lower substrate 14 and the upper substrate 13. Preferably, the resonator 10 is a MEMS vibrator manufactured by using MEMS technology.

Figure 2:
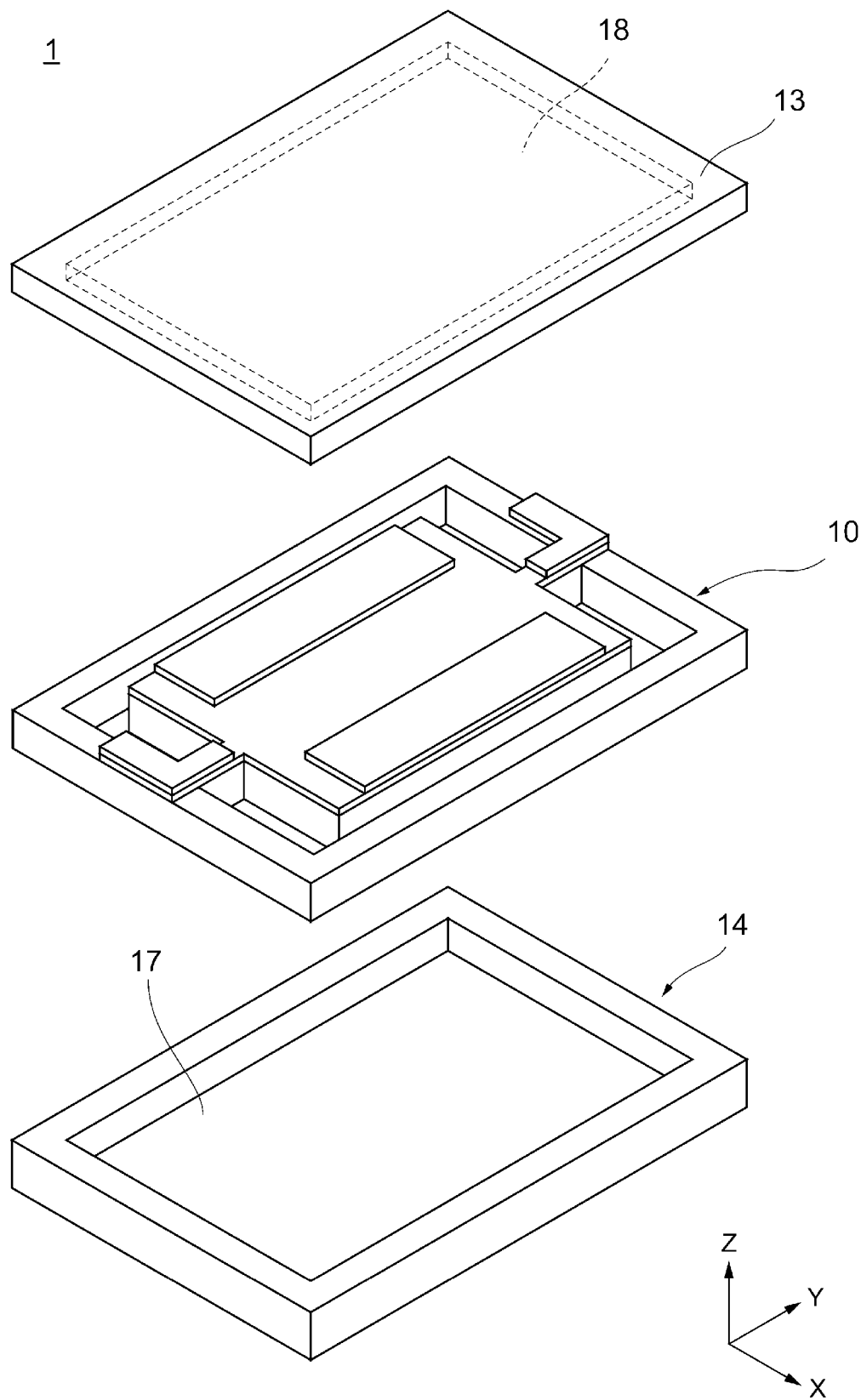
FIG. 2 is an exploded perspective view schematically illustrating the structure of the resonator device according to the first exemplary embodiment.

FIG. 2 is an exploded perspective view schematically illustrating the structure of the resonator device 1 according to the first exemplary embodiment. The lower substrate 14 extends in a flat-plate shape along the XY plane. A recess 17 having, for example, a flat rectangular-parallelepiped shape is formed in the upper surface of the lower substrate 14. The recess 17 forms a portion of the vibration space of the resonator 10. The upper substrate 13 extends in a flat-plate shape along the XY plane. A recess 18 having, for example, a flat rectangular-parallelepiped shape is formed in the lower surface of the upper substrate 13. The recess 18 forms a portion of the vibration space of the resonator 10. This vibration space is maintained in a vacuum. The lower substrate 14 and the upper substrate 13 are formed of, for example, silicon (Si).

Figure 3:
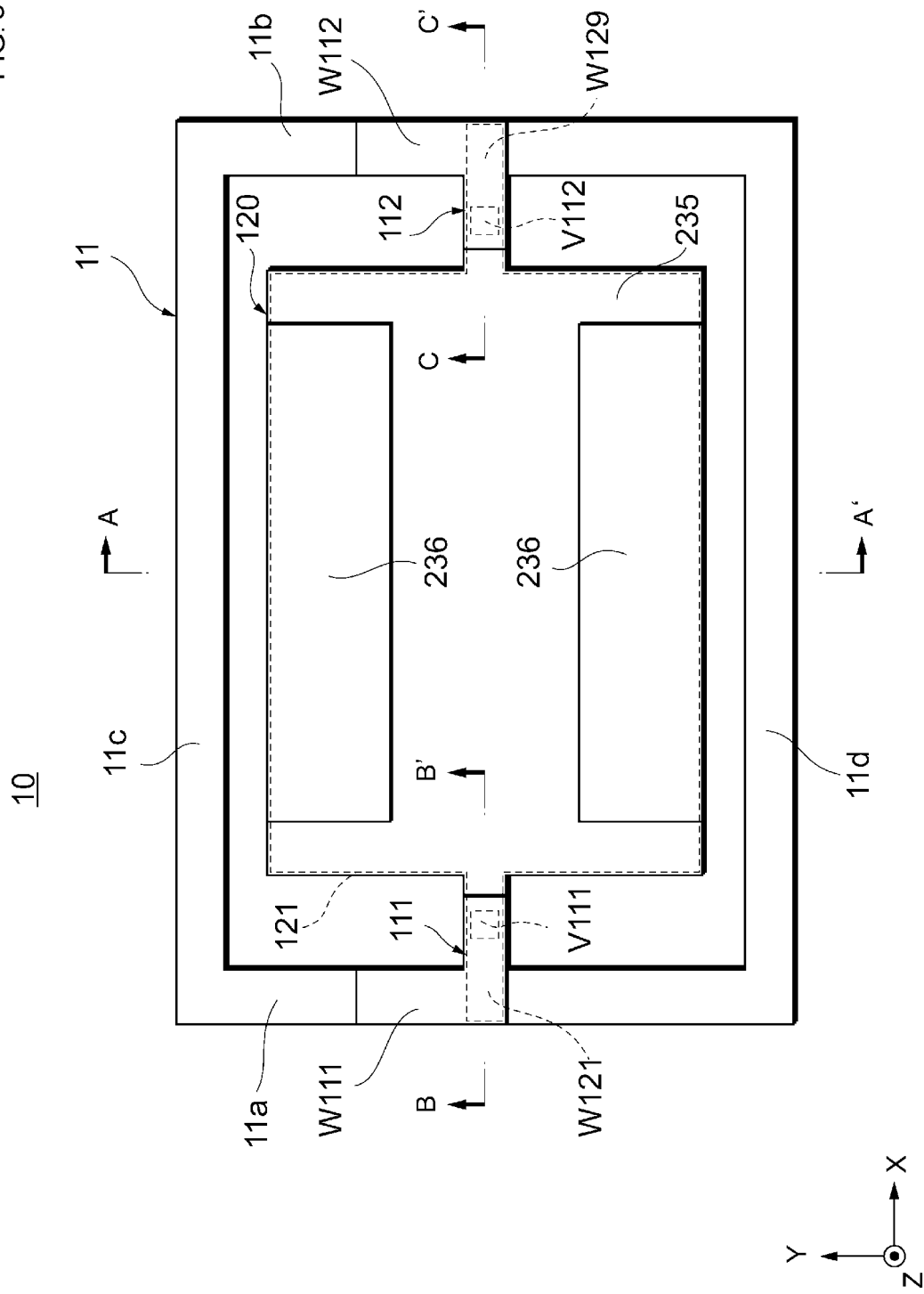
FIG. 3 is a plan view schematically illustrating an example structure of a resonator according to the first exemplary embodiment.

FIG. 3 is a plan view schematically illustrating the structure of the resonator 10 according to this embodiment. Components of the resonator 10 according to this embodiment are described with reference to FIG. 3. The resonator 10 includes a vibrating portion 120, a frame or holder 11 (there terms "frame" and "holder" are used interchangeably herein), holding units 111 and 112, and extended electrodes W111 and W112.

(1. Vibrating Portion 120)

(1-1. Exemplary Configuration)

In the exemplary embodiment, the vibrating portion 120 has a substantially rectangular-parallelepiped contour extending in a flat-plate shape along the XY plane according to the orthogonal coordinate system in FIG. 3. A rectangular-plate-shaped upper electrode 121 having a length direction and a width direction is provided on the vibrating portion 120. In FIG. 3, the vibrating portion 120 and the upper electrode 121 have long sides in the X-axis direction and short sides in the Y-axis direction.

A protection film 235 is formed to cover the entire surface of the upper electrode 121. Further, two adjustment films 236 are stacked on the surface of the protection film 235. The adjustment films 236 are parallel to the long sides of the vibrating portion 120. The protection film 235 and the adjustment films 236 adjust the resonant frequency of the vibrating portion 120.

The adjustment films 236 are formed so that the surfaces thereof are exposed in regions with a relatively large displacement in the vibrating portion 120. To be specific, the adjustment films 236 are formed to be exposed in regions near both ends in the short-side direction of the vibrating portion 120. Also, the surface of the protection film 235 is exposed in the other region.

A space is formed between the vibrating portion 120 and the holder 11 by a predetermined distance. In the example in FIG. 3, the vibrating portion 120 is connected to and held by the holder 11 by using the holding units 111 and 112 (described later) at a pair of short sides of the vibrating portion 120. On the other hand, the vibrating portion 120 is not held by the holder 11 at a pair of long sides of the vibrating portion 120.

(1-2. Stack Structure)

Figure 4:
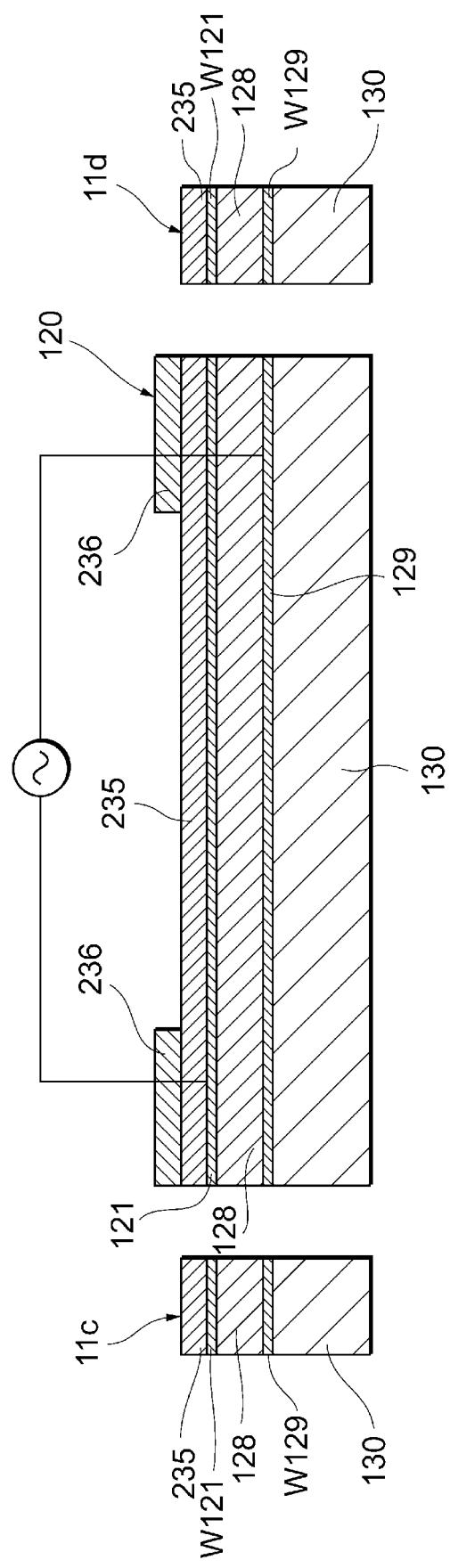
FIG. 4 is an illustration schematically illustrating an example structure in a cross section of the resonator according to the first exemplary embodiment.

FIG. 4 is a cross-sectional view taken along line A-A' in FIG. 3. The stack structure of the vibrating portion 120 is described with reference to FIG. 4.

As illustrated in FIG. 4, in the vibrating portion 120, a lower electrode 129 (an example of a second electrode) is stacked on a Si substrate 130 made of degenerate Si. The Si substrate 130 has, for example, a length of about 140 μm, a width of about 400 μm, and a thickness of about 10 μm. The lower electrode 129 is formed of metal, for example, molybdenum (Mo) or aluminum (Al), and has a thickness of about 0.1 μm. Alternatively, the Si substrate 130 made of degenerate Si may be used as a lower electrode without formation of the lower electrode 129.

Moreover, a piezoelectric thin film 128 is stacked on the lower electrode 129 so as to cover the lower electrode 129. Further, an upper electrode 121 (an example of a first electrode) is stacked on the piezoelectric thin film 128. For another example, the upper electrode 121 may be divided into a plurality of upper electrodes as will be explained in more detail below with respect to FIG. 7, for example.

The piezoelectric thin film 128 is a thin film of a piezoelectric substance that transforms an applied voltage into a vibration. For example, the main component of the piezoelectric substance may be a nitride such as aluminum nitride, or an oxide. To be specific, the piezoelectric thin film 128 may be formed of scandium aluminum nitride (ScAlN). ScAlN is obtained by replacing part of aluminum (Al) in aluminum nitride (AlN) with scandium (Sc). Also, the piezoelectric thin film 128 has, for example, a thickness of 0.8 μm.

Also, the upper electrode 121 is preferably formed of metal, for example, molybdenum (Mo) or aluminum (Al), and has a thickness of about 0.1 μm similarly to the lower electrode 129.

In the exemplary embodiment, a protection film 235 is stacked on the upper electrode 121 so as to cover the upper electrode 121. Further, an adjustment film 236 is stacked on the protection film 235. The adjustment film 236 is formed on the substantially entire surface of the vibrating portion 120, and then is partly removed by processing such as etching. Hence the adjustment film 236 is formed in only a predetermined region.

The protection film 235 is formed of a material the mass of which is decreased by etching at a lower rate than that of the adjustment film 236. For example, the protection film 235 is formed of a nitride film of AlN or the like, or an oxide film of $SiO_2$ or the like. The mass decrease rate is expressed by the product of the etching rate (thickness removed per unit time) and the density.

The adjustment film 236 is formed of a material the mass of which is decreased by etching at a higher rate than that of the protection film 235. For example, the adjustment film 236 is formed of metal, such as molybdenum (Mo), tungsten (W), gold (Au), platinum (Pt), nickel (Ni), or other metal.

As long as the relationship of the mass decrease rate between the protection film 235 and the adjustment film 236 is as describe above, the degree of etching rate is desirably determined.

Etching on the protection film 235 and the adjustment film 236 may be performed, for example, by simultaneously irradiating the protection film 235 and the adjustment film 236 with ion beams (for example, argon (Ar) ion beams). The irradiation with ion beams can be provided in a wide area than the resonator 10. While etching uses ion beams in this embodiment, the etching method is not limited to the method using ion beams.

(1-3. Functions)

Functions of respective layers of the vibrating portion 120 are described. The vibrating portion 120 provides contour vibration in the XY plane when an alternating electric field is applied to the vibrating portion 120.

For example, in the exemplary embodiment, the piezoelectric thin film 128 is oriented in a c-axis direction, i.e., the piezoelectric layer can have a crystallographic axis that extends at an angle relative to the vertical axis of the resonator. When a predetermined electric field is applied to the upper electrode 121 and the lower electrode 129 and a predetermined electric potential difference is formed between the lower electrode 129 and the upper electrode 121, the piezoelectric thin film 128 expands and contracts in the XY plane direction in accordance with the electric potential difference. Thus the vibrating portion 120 provides contour vibration.

Main elements that determine the resonant frequency of the vibrating portion 120 includes a mass and a spring constant. By etching the protection film 235 and the adjustment film 236, the mass and the spring constant are simultaneously decreased. The decrease in mass increases the resonant frequency, and the decrease in spring constant decreases the resonant frequency. The influence of the mass is relatively strong in a region with a large displacement, and the influence of the spring constant is relatively strong in a region with a small displacement.

In the vibrating portion 120, the adjustment film 236 is formed to be exposed in the region with the relatively large displacement in the vibrating portion 120. As described above, the mass decrease rate by ion beams of the adjustment film 236 is higher than that of the protection film 235. Hence, the mass in a region with a relatively large displacement is decreased faster. Accordingly, the resonant frequency can be increased. The protection film 235 is also etched simultaneously with the adjustment film 236. However, the amount of change in spring constant is small because the mass decrease rate of the protection film 235 is lower than that of the adjustment film 236. Hence, the influence of the decrease in resonant frequency caused by the change in spring constant is small. Therefore, the resonant frequency can be efficiently adjusted in the vibrating portion 120 by simultaneously irradiating the protection film 235 and the adjustment film 236 ion beams.

The temperature characteristics of the resonant frequency are affected by the change in spring constant. However, since the amount of change in spring constant is small in the vibrating portion 120 as described above, the change in temperature characteristics of the resonant frequency can be decreased.

Referring back to FIG. 3, other components of the resonator 10 are described.

(2. Holder 11)

(2-1. Specific Configuration)

The holder 11 is formed in a rectangular frame shape along the XY plane according to this embodiment. The holder 11 is only required to be provided at least at a portion of the periphery of the vibrating portion 120. The shape of the holder 11 is not limited to the frame shape. The holder 11 is provided to surround the vibrating portion 120 and the outside portion of the vibrating portion 120 along the XY plane. To be more specific, the holder 11 includes a pair of long-side plate-shaped frame bodies 11a and 11b extending in parallel to the Y-axis direction so as to face the short sides of the vibrating portion 120, and a pair of short-side frame bodies 11c and 11d extending in parallel to the X-axis direction so as to face the long sides of the vibrating portion 120. Both ends of the frame bodies 11c and 11d are respectively connected to both ends of the frame bodies 11a and 11b.

In the following description, the frame body 11c side is referred to as the upper side of the resonator 10, and the frame body 11d side is referred to as the lower side of the resonator 10.

(2-2. Stack Structure)

As illustrated in FIG. 4, a lower wire W129 is formed on the Si substrate 130 of the holder 11. The lower wire W129 is integrally formed with the lower electrode 129 of the vibrating portion 120 by the same process. Further, the piezoelectric thin film 128 is stacked so as to cover the lower wire W129, and the protection film 235 is stacked on the piezoelectric thin film 128. The holder 11 in which the Si substrate 130, the lower wire W129, the piezoelectric thin film 128, and an upper wire W121 (described later) are stacked in that order is integrally formed with the vibrating portion 120 in which the Si substrate 130, the lower electrode 129, the piezoelectric thin film 128, and the upper electrode 121 are stacked in that order. Then, the upper wire W121 is removed by processing such as etching so as to obtain a desirable shape and the protection film 235 is formed.

(3. Holding Units 111 and 112)

(3-1. Specific Configuration)

The holding unit 111 is provided between the short side of the vibrating portion 120 and the frame body 11a in a space inside the holder 11 along the XY plane. The holding unit 111 connects the short side of the vibrating portion 120 with the frame body 11a. The holding unit 112 is provided in a space between the short side of the vibrating portion 120 and the frame body 11b. The holding unit 112 connects the short side of the vibrating portion 120 with the frame body 11b.

(3-2. Stack Structure)

Figure 5A:
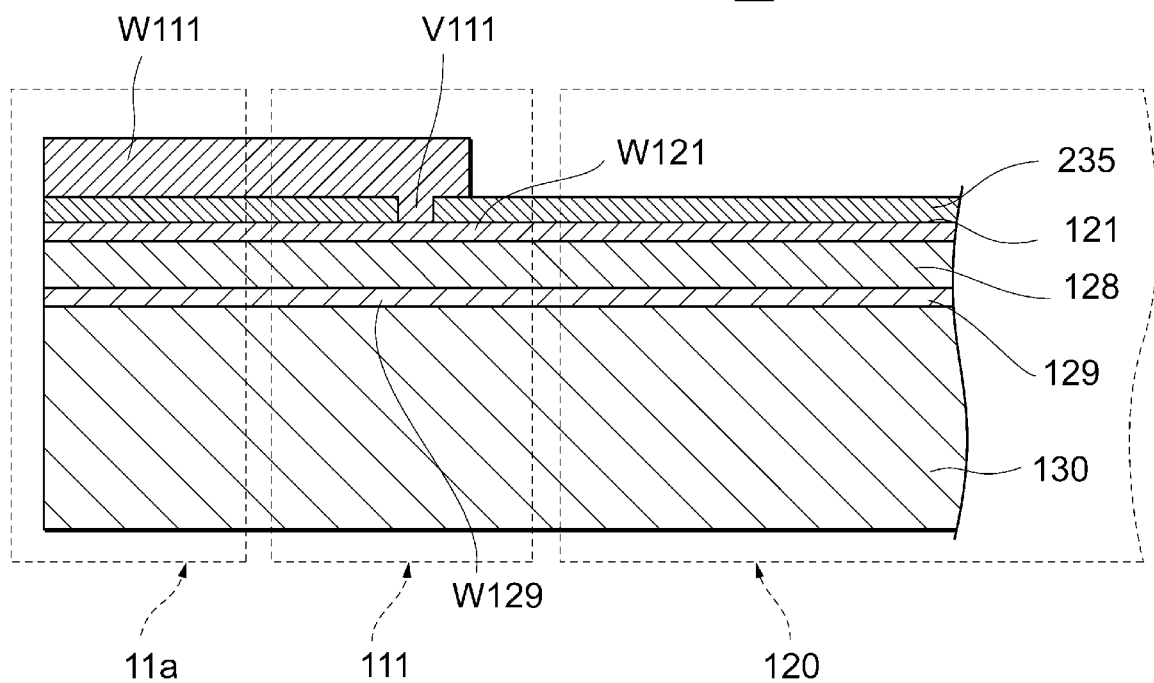
FIGS. 5(A) and 5(B) provide illustrations each schematically illustrating an example structure in a cross section of the resonator according to the first exemplary embodiment.
Figure 5B:
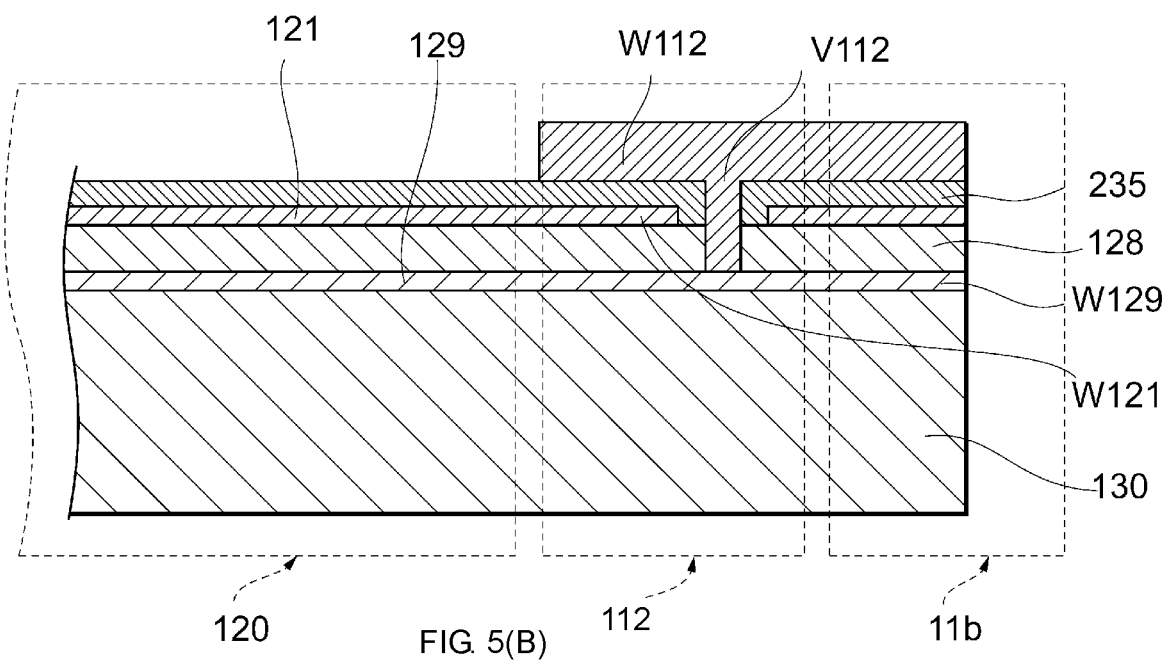

FIG. 5(A) is a cross-sectional view taken along line B-B' in FIG. 3. FIG. 5(B) is a cross-sectional view taken along line C-C' in FIG. 3. The stack structures of the holding units 111 and 112 are described with reference to FIGS. 5(A) and 5(B).

As illustrated in FIGS. 5(A) and 5(B), in the holding units 111 and 112, the lower wire W129 is stacked on the Si substrate 130 made of a degenerate semiconductor. The lower wire W129 is integrally formed with the lower electrode 129 of the vibrating portion 120 by the same process. The lower electrode 129 and the lower wire W129 are continuously formed to extend from the vibrating portion 120 to the holding units 111 and 112.

The piezoelectric thin film 128 is stacked on the lower wire W129 so as to cover the lower wire W129. Further, the upper wire W121 is provided on the piezoelectric thin film 128. The upper wire W121 is integrally formed with the upper electrode 121 of the vibrating portion 120 by the same process. The upper electrode 121 and the upper wire W121 are continuously formed to extend from the vibrating portion 120 to the holding units 111 and 112.

The Si substrate 130, the lower wire W129, the piezoelectric thin film 128, and the upper wire W121 of the holding units 111 and 112 are respectively integrally formed with the Si substrate 130, the lower electrode 129, the piezoelectric thin film 128, and the upper electrode 121 of the vibrating portion 120. The upper wire W121 is removed so as to have a desirable shape by processing such as etching, and then the protection film 235 is stacked.

(4. Extended Electrode W111)

(4-1. Specific Configuration)

The extended electrode W111 is formed to extend from the frame body 11a to the holding unit 111. The extended electrode W111 is connected to the upper wire W121 on the holding unit 111. The upper wire W121 is formed continuously from the upper electrode 121 of the vibrating portion 120 to the holding unit 111. To be specific, the upper wire W121 is formed to continuously cover an area from a connection position between the upper electrode 121 of the vibrating portion 120 and the holding unit 111 to a connection position between an intermediate point of the holding unit 111 or the holding unit 111 and the frame body 11a.

The extended electrode W111 is formed continuously from a connection position with the upper wire W121 to the frame body 11a.

The extended electrode W111 is formed so that its electrical resistance value per unit area is smaller than that of the upper wire W121. In this embodiment, the extended electrode W111 is formed to be thicker than the upper wire W121. The extended electrode W111 is made of metal with high electrical conductivity, such as aluminum. Further, the extended electrode W111 may be desirably made of a light metal. Accordingly, the interruption of the vibration of the vibrating portion 120 by the extended electrode W111 can be reduced. The extended electrode W111 may be formed simultaneously with the adjustment film 236 by using the same material.

(4-2. Cross-Sectional Structure)

The structure in a cross section of the extended electrode W111 is described with reference to FIG. 5(A). The extended electrode W111 is formed to extend from the surface of the protection film 235 of the holding unit 111 to the surface of the protection film 235 of the frame body 11a. The extended electrode W111 is connected to the upper electrode W121 through a via V111 that is formed on the holding unit 111 so as to penetrate through the protection film 235.

The via V111 is formed, for example, by removing a portion of the protection film 235 by etching etc. after the protection film 235 is formed on the resonator 10. After the via V111 is formed, a light metal with high conductivity, such as aluminum, is stacked on the protection film 235 and in the via V111, and a portion of the metal is removed by etching etc. Thus the extended electrode W111 is formed. Alternatively, the via V111 may be filled with metal, and then, the extended electrode W111 may be stacked.

The resonator 10 according to this embodiment can decrease the path resistance in the holding unit 111 and improve the vibration characteristics by extending the upper wire W121 using the extended electrode W111 having the electrical resistance value per unit area in the XY plane being smaller than that of the upper electrode 121.

(5. Extended Electrode W112)

(5-1. Specific Configuration)

The extended electrode W112 is formed to extend from the frame body 11b to the holding unit 112. The extended electrode W112 is connected to the lower wire W129 on the holding unit 112. The lower wire W129 is formed continuously from the lower electrode 129 of the vibrating portion 120 to the holding unit 112. To be specific, the lower wire W129 is formed to continuously cover an area from a connection position between the lower electrode 129 of the vibrating portion 120 and the holding unit 112 to a connection position between an intermediate point of the holding unit 112 or the holding unit 112 and the frame body 11b.

The extended electrode W112 is formed continuously from a connection position with the lower wire W129 to the frame body 11b.

The extended electrode W112 is formed so that its electrical resistance value per unit area is smaller than that of the lower wire W129. In this embodiment, the extended electrode W112 is formed to be thicker than the lower wire W129. The extended electrode W112 is made of metal with high conductivity, such as aluminum. Further, the extended electrode W112 may be desirably a light metal. Accordingly, the interruption of the vibration of the vibrating portion 120 by the extended electrode W112 can be reduced. The extended electrode W112 may be formed simultaneously with the adjustment film 236 by using the same material.

(5-2. Cross-Sectional Structure)

FIG. 5(B) is a cross-sectional view taken along line C-C' in FIG. 3. The structure in a cross section of the extended electrode W112 is described with reference to FIG. 5(B). The extended electrode W112 is formed to extend from the surface of the protection film 235 of the holding unit 112 to the surface of the protection film 235 of the frame body 11b. The extended electrode W112 is connected to the lower electrode W129 through a via V112 that is formed on the holding unit 112 so as to penetrate through the protection film 235, the upper wire W121, and the piezoelectric thin film 128. The piezoelectric thin film 128 is arranged between the via V112 and the upper wire W121.

The via V112 is formed, for example, after the upper wire W121 is formed on the resonator 10 and the hole formed by removing (etching etc.) a portion of the upper wire W121 is filled with the protection film 235, by etching the protection film 235 stacked in the hole and a portion of the piezoelectric thin film 128. After the via V112 is formed, a light metal with high electrical conductivity, such as aluminum, is stacked on the protection film 235 and in the via V112, and a portion of the metal is removed by etching etc. Thus the extended electrode W112 is formed. Alternatively, the via V112 may be filled with metal, and then, the extended electrode W112 may be stacked.

The resonator 10 according to this embodiment can decrease the path resistance in the holding unit 112 and improve the vibration characteristics by extending the lower electrode 129 by using the extended electrode W112 having the electrical resistance value per unit area being smaller than that of the lower electrode 129.

Second Embodiment

When a second embodiment and later embodiments are described, the description on the matters common to the first embodiment is omitted, and only different points are described. In particular, similar advantageous effects obtained by similar configurations are not repeated in respective embodiments.

Figure 6:
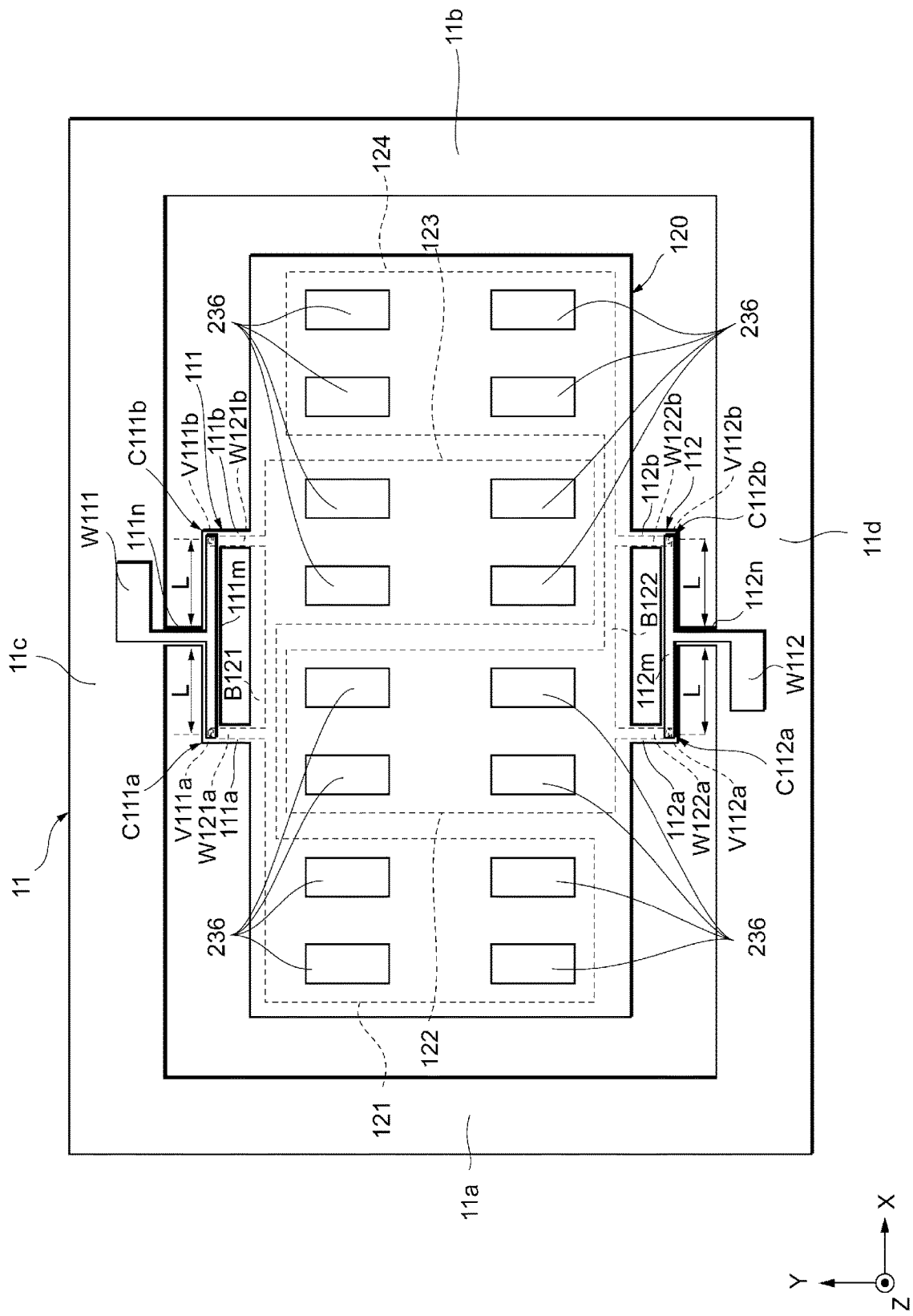
FIG. 6 is a plan view schematically illustrating an example structure of a resonator according to a second exemplary embodiment.

FIG. 6 is a plan view schematically illustrating an example structure of a resonator 10 according to this embodiment. The points different from the first embodiment are mainly described below in the specific configuration of the resonator 10 according to this embodiment. The resonator 10 according to this embodiment includes, in addition to the configuration described in the first embodiment, busbars B121 and B122, and wires W121a, W121b, W122a, and W122b.

(1. Vibrating Portion 120)

In this embodiment, a vibrating portion 120 includes four upper electrodes 121 to 124. The upper electrodes 121 and 123 are connected by the busbar B121 (described later).

The upper electrodes 122 and 124 are connected by the busbar B122 (described later).

An adjustment film 236 is formed to be exposed in regions corresponding to four corners of each of the upper electrodes 121 to 124. A protection film 235 is formed to be exposed in the other region. Alternatively, the protection film 235 may be formed on the vibrating portion 120, for example, only in a region covering the upper electrodes 121 to 124.

Further, an electric field is applied to the upper electrodes 121 to 124 of the vibrating portion 120 in a manner that neighboring electrodes have opposite phases. A lower electrode 129 is in a floating state according to this embodiment. The other configuration of the vibrating portion 120 is similar to that according to the first embodiment.

(2. Holder 11)

A holder 11 is connected to holding units 111 and 112 by frame bodies 11c and 11d. The other configuration of the holder 11 is similar to that according to the first embodiment.

(3. Holding Units 111 and 112)

In this embodiment, the holding unit 111 connects the frame body 11c with the vibrating portion 120.

The holding unit 111 includes an arm 111a (an example of a second arm), an arm 111b (an example of a second arm), an arm 111m (an example of a first arm), and an arm 111n.

The arm 111m faces the long side of the vibrating portion 120 and extends in parallel to the X-axis direction.

The holding unit 111 is connected to the vibrating portion 120 by the two arms 111a and 111b. A first end of the arm 111a is connected to a long side of the vibrating portion 120 at a position around the center of a short side of the upper electrode 122. A second end of the arm 111a is connected to a first end portion of the arm 111m (hereinafter, also referred to as "bending portion C111a") substantially perpendicularly to the arm 111m. A first end of the arm 111b is connected to the long side of the vibrating portion 120 at a position around the center of a short side of the upper electrode 123. A second end of the arm 111b is connected to a second end portion of the arm 111m (hereinafter, also referred to as "bending portion C111b") substantially perpendicularly to the arm 111m.

One end of the arm 111n is connected to a portion around the center of the arm 111m substantially perpendicularly to the arm 111m. A second end of the arm 111n is connected to the frame body 11c. That is, the holding unit 111 bends at the connection position between the arm 111a and the arm 111m and the connection position between the arm 111b and the arm 111m, and the arm 111m is coupled to the one arm 111n at the intermediate point.

Since the holding unit 111 according to this embodiment bends at the bending portions C111a and C111b and coupled to the one at the intermediate point, the number of connection points between the holder 11 and the holding unit 111 can be decreased. As the result, attenuation of vibration of the vibrating portion 120, which is generated if the number of connection points between the holder 11 and the holding unit 111 is increased, can be decreased.

Next, the relationship between the lengths of the components of the holding unit 111 and the wavelength with which the vibrating portion 120 vibrates is described.

It is assumed that L denotes a length from the connection point between the center of the arm 111m and the arm 111n in the holding unit 111 to the bending portion C111a or C111b, and λ is a wavelength of vibration of the vibrating portion 120. In this embodiment, in the holding unit 111, the length L is adjusted so that the relational expression $L=\lambda/4$ is established. Accordingly, the vibration characteristics of the vibrating portion 120 can be increased.

To be specific, the arm 111m of the holding unit 111 vibrates with the same wavelength λ as that of the vibrating portion 120. Hence, since the length L is λ/4, the bending portions C111a and C111b can be provided at positions corresponding to nodes of vibration waves. Accordingly, acoustic reflex effect by the bending portions C111a and C111b can be increased, and confinement of vibration can be increased.

On the other hand, the holding unit 112 connects the frame body 11d with the vibrating portion 120.

The holding unit 112 includes an arm 112a (an example of a second arm), an arm 112b (an example of a second arm), an arm 112m (an example of a first arm), and an arm 112n.

The arm 112m faces the long side of the vibrating portion 120 and extends in parallel to the X-axis direction.

The holding unit 112 is connected to the vibrating portion 120 by the two arms 112a and 112b. A first end of the arm 112a is connected to a long side of the vibrating portion 120 at a position around the center of a short side of the upper electrode 122. A second end of the arm 112a is connected to a first end portion of the arm 112m (hereinafter, also referred to as "bending portion C112a") substantially perpendicularly to the arm 111m. A first end of the arm 112b is connected to the long side of the vibrating portion 120 at a position around the center of a short side of the upper electrode 123. A second end of the arm 112b is connected to a second end portion of the arm 112m (hereinafter, also referred to as "bending portion C112b") substantially perpendicularly to the arm 112m.

One end of the arm 112n is connected to a portion around the center of the arm 112m substantially perpendicularly to the arm 112m. A second end of the arm 112n is connected to the frame body 11d. That is, the holding unit 112 bends at the connection position between the arm 112a and the arm 112m and the connection position between the arm 112b and the arm 112m, and the arm 112 is coupled to the one arm 112n at the intermediate point.

Since the holding unit 112 according to this embodiment bends at the bending portions C112a and C112b and coupled to the one at the intermediate point, the number of connection points between the holder 11 and the holding unit 112 can be decreased. As the result, attenuation of vibration of the vibrating portion 120, which is generated if the number of connection points between the holder 11 and the holding unit 112 is increased, can be decreased.

The length from the connection point between the center of the arm 112m and the arm 112n in the holding unit 112 to the bending portion C112a or C112b is also adjusted to be the length L. Accordingly, acoustic reflex effect by the bending portions C112a and C112b can be increased, and confinement of vibration can be increased.

(4. Busbars B121 and B122)

The busbar B121 is provided at an end portion on the frame body 11c side of the vibrating portion 120 so as to face the upper electrode 122. The busbar B121 is connected to an upper end (an end portion on the frame body 11c side) of the long side of the upper electrode 121 facing the upper electrode 122, and to an upper end (an end portion on the frame body 11c side) of the long side of the upper electrode 123 facing the upper electrode 122.

The busbar B122 is provided at an end portion on the frame body 11d side of the vibrating portion 120 so as to face the upper electrode 123. The busbar B122 is connected to a lower end (an end portion on the frame body 11d side) of the long side of the upper electrode 122 facing the upper electrode 123, and to a lower end (an end portion on the frame body 11d side) of the long side of the upper electrode 124 facing the upper electrode 123.

(5. Wires W121a, W121b, W122a, and W122b)

The wire W121a is connected to a portion around the center of the busbar B121, extends from the connection position in a direction substantially perpendicular to the busbar B121, and is provided from a surface of the arm 111a (between the piezoelectric thin film 128 and the protection film 235 of the arm 111a) to a surface (between the piezoelectric thin film 128 and the protection film 235 of the arm 111m) at a first end (the bending portion C111a) of the arm 111m. The wire 121b is connected to a portion around the center of a short side on the frame body 11c side of the upper electrode 123, extends from the connection position in a direction perpendicular to the short side, and is provided from a surface of the arm 111b to a surface (between the piezoelectric thin film 128 and the protection film 235 of the arm 111m) at a second end (bending portion C111b) of the arm 111m.

The wires W122a and W122b have similar structures as those of the wires W121b and W121a.

(6. Extended Electrode W111)

In this embodiment, an extended electrode W111 is formed to extend from the frame body 11c to the holding unit 111. The extended electrode W111 according to this embodiment has a T shape on the side not connected to the frame body 11c. End portions of the T shape of the extended electrode W111 respectively extend to the bending portions C111a and C111b of the holding unit 111.

In this embodiment, the extended electrode W111 is connected to the wire W121a at the bending portion C111a, and is connected to the wire W121b at the bending portion C111b. The extended electrode W111 is connected to the wires W121a and W121b through vias V111a and V111b formed in the bending portions C111a and C111b of the holding unit 111 so as to penetrate through the protection film 235.

By forming the vias V111a and V111b in the bending portions C111a and C111b provided at the positions with the length L each being λ/4 as described above, the stiffness and mass of the bending portions C111a and C111b can be increased. Accordingly, the acoustic reflex effect by the bending portions C111a and C111b can be increased, and the confinement of vibration can be further increased. The other configuration and function of the extended electrode W111 are similar to those of the first embodiment.

(7. Extended Electrode W112)

In this embodiment, an extended electrode W112 is formed to extend from the frame body 11d to the holding unit 112. The extended electrode W112 according to this embodiment has a T shape on the side not connected to the frame body 11d. End portions of the T shape of the extended electrode W112 respectively extend to the bending portions C112a and C112b of the holding unit 112.

In this embodiment, the extended electrode W112 is connected to the wire W122a at the bending portion C112a, and is connected to the wire W122b at the bending portion C112b. The extended electrode W112 is connected to the wires W122a and W122b through vias V112a and V112b formed in the bending portions C112a and C112b of the holding unit 112 so as to penetrate through the protection film 235.

By forming the vias V112a and V112b in the bending portions C112a and C112b provided at the positions with the length L each being λ/4 as described above, the stiffness and mass of the bending portions C112a and C112b can be increased. Accordingly, the acoustic reflex effect by the bending portions C112a and C112b can be increased, and the confinement of vibration can be further increased. The other configuration and function of the extended electrode W112 are similar to those of the first embodiment.

The other configuration and effect are similar to those according to the first embodiment.

Third Embodiment

Figure 7:
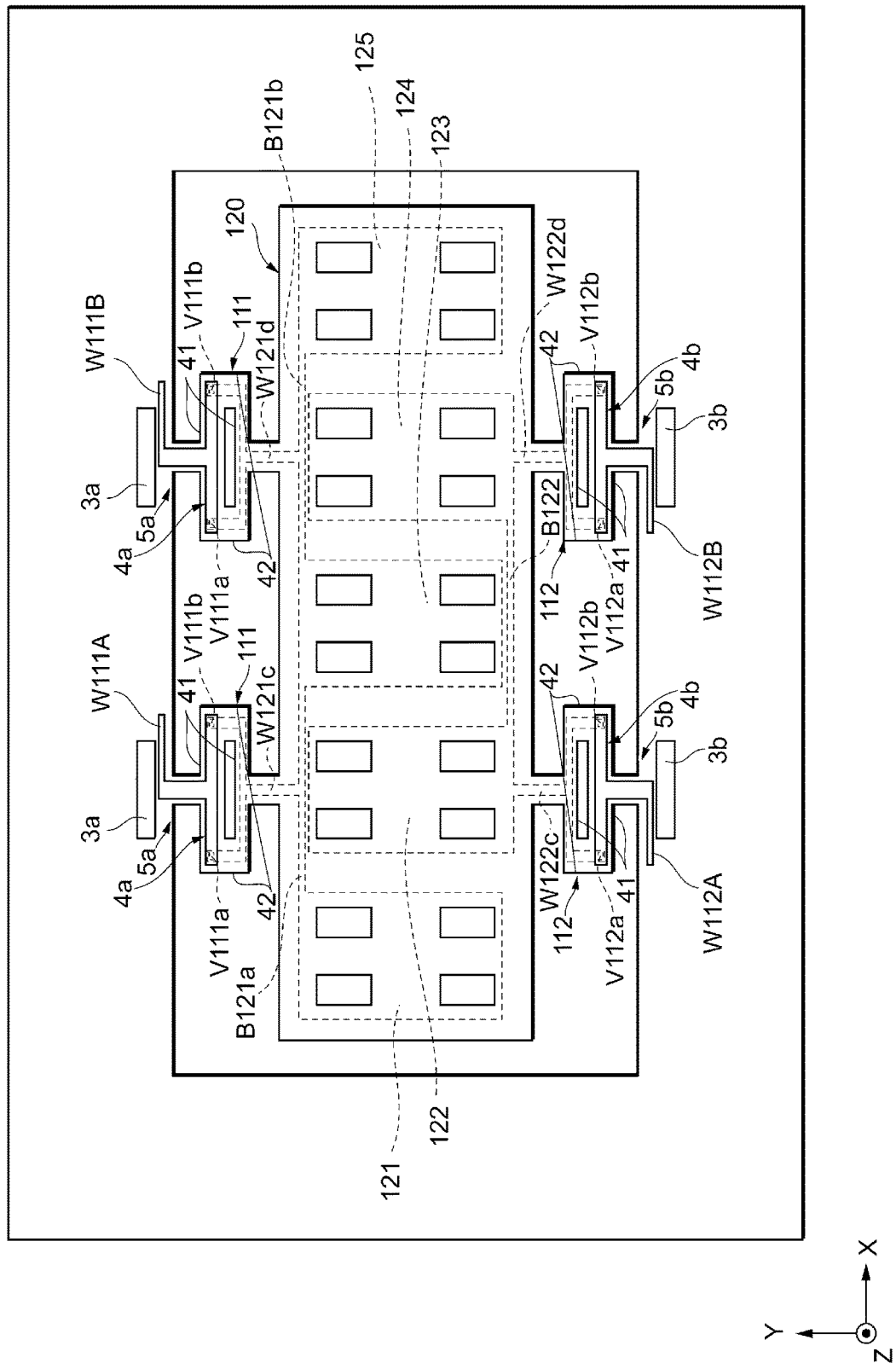
FIG. 7 is a plan view schematically illustrating an example structure of a resonator according to a third exemplary embodiment.

FIG. 7 is a plan view schematically illustrating an example structure of a resonator 10 according to this embodiment. The points different from the first embodiment are described below from among components of the resonator 10 according to this embodiment. The resonator 10 according to this embodiment includes, in addition to the configuration described in the first embodiment, busbars B121a, B121b, and B122, wires W121c, W121d, W122c, and W122d, and extended electrodes W111A, W111B, W112A, and W112B.

(1. Vibrating Portion 120)

In this embodiment, a vibrating portion 120 includes five upper electrodes 121 to 125.

An adjustment film 236 is formed to be exposed in regions corresponding to four corners of each of the upper electrodes 121 to 125 (examples of a plurality of first electrodes). A protection film 235 is formed to be exposed in the other region. Alternatively, the protection film 235 may be formed on the vibrating portion 120 only in a region covering the upper electrodes 121 to 125.

An electric field is applied to the upper electrodes 121 to 125 of the vibrating portion 120 in a manner that neighboring electrodes have opposite phases according to the exemplary embodiment. That is, a first portion of upper electrodes 121, 123 and 125 can have a first phase while a second portion of upper electrodes 122 and 124 can have a second and opposite phase, for example. Moreover, the lower electrode 129 can be a floating electrode, i.e., it is in a floating state according to this embodiment. The other configuration and function of the vibrating portion 120 are similar to those according to the first embodiment.

(2. Holder 11)

In this embodiment, a holder 11 includes four bending vibrating portions 5a and 5b at connection positions between the holder 11 and holding units 111 and 112. The holder 11 has slits 3a and 3b, and the bending vibrating portions 5a and 5b are portions provided between the slits 3a, 3b and the holding units 111, 112. That is, the holder 11 has the slits 3a and 3b extending in a direction orthogonal to the extending direction of the holding units 111 and 112. Outer first edges of the bending vibrating portions 5a and 5b face the slits 3a and 3b, and second edges thereof face a space between the holder 11 and the vibrating portion 120.

The bending vibrating portions 5a and 5b are formed such that the distance from an end portion of each of the bending vibrating portions 5a and 5b to a connection point with respect to the midpoint of corresponding one of the holding units 111 and 112 is $\lambda/4$. Accordingly, the acoustic reflex effect at the end portions of the bending vibrating portions 5a and 5b can be increased, and the confinement of vibration can be increased.

(3. Holding Units 111 and 112)

In this embodiment, the resonator 10 includes two pairs of holding units 111 and 112. The holding units 111 and 112 respectively have vibration absorbing portions 4a and 4b protruding in a direction orthogonal to the holding units 111 and 112. The vibration absorbing portions 4a and 4b each are formed of two pairs of opposite arms 41 and opposite arms 42. The arms 41 (an example of a pair of first arms) extend in a direction substantially parallel to a long side of the vibrating portion 120. The arms 42 (an example of a pair of second arms) are provided in a direction substantially perpendicular to the arms 41, and both ends of the arms 42 are respectively connected to both ends of the arms 41.

In this embodiment, since the holding units 111 and 112 have the vibration absorbing portions 4a and 4b, the propagation of vibration to the bending vibrating portions 5a and 5b can be reduced, and the vibration with harmonic of the contour vibration propagating from the vibrating portion 120 can be efficiently confined.

The other configuration and function of the holding units 111 and 112 are similar to those according to the first embodiment.

(4. Busbars B121a, B121b, and B122)

The busbar B121a has a configuration equivalent to the busbar B121 according to the second embodiment. The busbar B122 has a configuration equivalent to the busbar B122 according to the second embodiment.

The busbar B121b is provided at an end portion on the frame body 11c side of the vibrating portion 120 so as to face the upper electrode 124. The busbar B121b is connected to an upper end (an end portion on the frame body 11c side) of the long side of the upper electrode 123 facing the upper electrode 124, and to an upper end (an end portion on the frame body 11c side) of the long side of the upper electrode 125 facing the upper electrode 124.

(5. Wires W121c, W121d, W122c, and W122d)

The wire W121c is connected to a portion around the center of the busbar B121a. The wire W121c extends from the connection position with respect to the busbar B121a to the busbar B121a substantially perpendicularly to the busbar B121a, is branched into two at a portion around the center of the arm 41 (on the vibrating portion 120 side) on the vibration absorbing portion 4a, and extends along the arm 41. The wire W121c branched into two bends in a direction perpendicular to the arms 41 along the arm 42 at the connection positions between the arms 41 and the arm 42 (on the vibrating portion 120 side), and extends to upper ends (on the frame body 11c side) of the arms 42.

The wire W121d is connected to a portion around the center of the busbar B121b. The other configuration and function of the wire W121d are similar to the configuration and function of the wire W121c.

The wire W122c is connected to a portion around the center of the short side on the lower side (on the frame body 11d side) of the upper electrode 122. The other configuration and function of the wire W122c are similar to the configuration and function of the wire W121a.

The wire W122d is connected to a portion around the center of the short side on the lower side (on the frame body 11d side) of the upper electrode 124. The other configuration and function of the wire W122d are similar to the configuration and function of the wire W121a.

(6. Extended Electrodes W111A and W111B)

In this embodiment, the extended electrode W111A is formed to extend from the frame body 11c to the holding unit 111. The extended electrode W111A according to this embodiment has a T shape on the side not connected to the frame body 11c. End portions of the T shape of the extended electrode W111A respectively extend to both ends of the arm (on the frame body 11c side) of the vibration absorbing portion 4a of the holding unit 111.

In this embodiment, the extended electrode W111A is connected to the wire W121c at both ends of the arm 41 on the frame body 11c side of the vibration absorbing portion 4a. The extended electrode W111A is connected to the wire W121c through vias V111a and V111b formed at both ends of the arm 41 on the frame body 11c side of the vibration absorbing portion 4a so as to penetrate through the protection film 235.

The configuration and function of the extended electrode W111B are similar to the configuration and function of the extended electrode W111A.

Since the vias V111a and V111b are provided on both ends of the vibration absorbing portion 4a, the stiffness and mass at both ends of the vibration absorbing portion 4a are increased. As the result, the propagation of vibration to the holding unit 111 can be more effectively reduced at the vibration absorbing portion 4a. The vibration of harmonic of the contour vibration propagating from the vibrating portion 120 can be further reliably confined.

The configuration and function of the extended electrodes W111A and W111B are similar to the configuration and function of the extended electrode W111 according to the first embodiment.

(5. Extended Electrodes W112A and W112B)

In this embodiment, an extended electrode W112A is formed to extend from the frame body 11d to the holding unit 112. The extended electrode W112A according to this embodiment has a T shape on the side not connected to the frame body 11d. End portions of the T shape of the extended electrode W112A respectively extend to both ends of the vibration absorbing portion 4b of the holding unit 112.

In this embodiment, the extended electrode W112A is connected to the wire W122c at both ends of the arm 41 on the frame body 11d side of the vibration absorbing portion 4b. The extended electrode W112A is connected to the wire W122c through vias V112a and V112b formed at both ends of the arm 41 on the frame body 11d side of the vibration absorbing portion 4b so as to penetrate through the protection film 235.

The configuration and function of the extended electrode W112B are similar to the configuration and function of the extended electrode W112A.

Since the vias V112a and V112b are provided on both ends of the vibration absorbing portion 4b, the stiffness and mass at both ends of the vibration absorbing portion 4b are increased. As the result, the propagation of vibration to the holding unit 112 can be more effectively reduced at the vibration absorbing portion 4b. The vibration of harmonic of the contour vibration propagating from the vibrating portion 120 can be further reliably confined.

The configuration and function of the extended electrodes W112A and W112B are similar to the configuration and function of the extended electrode W112 according to the first embodiment.

Fourth Embodiment

Figure 8:
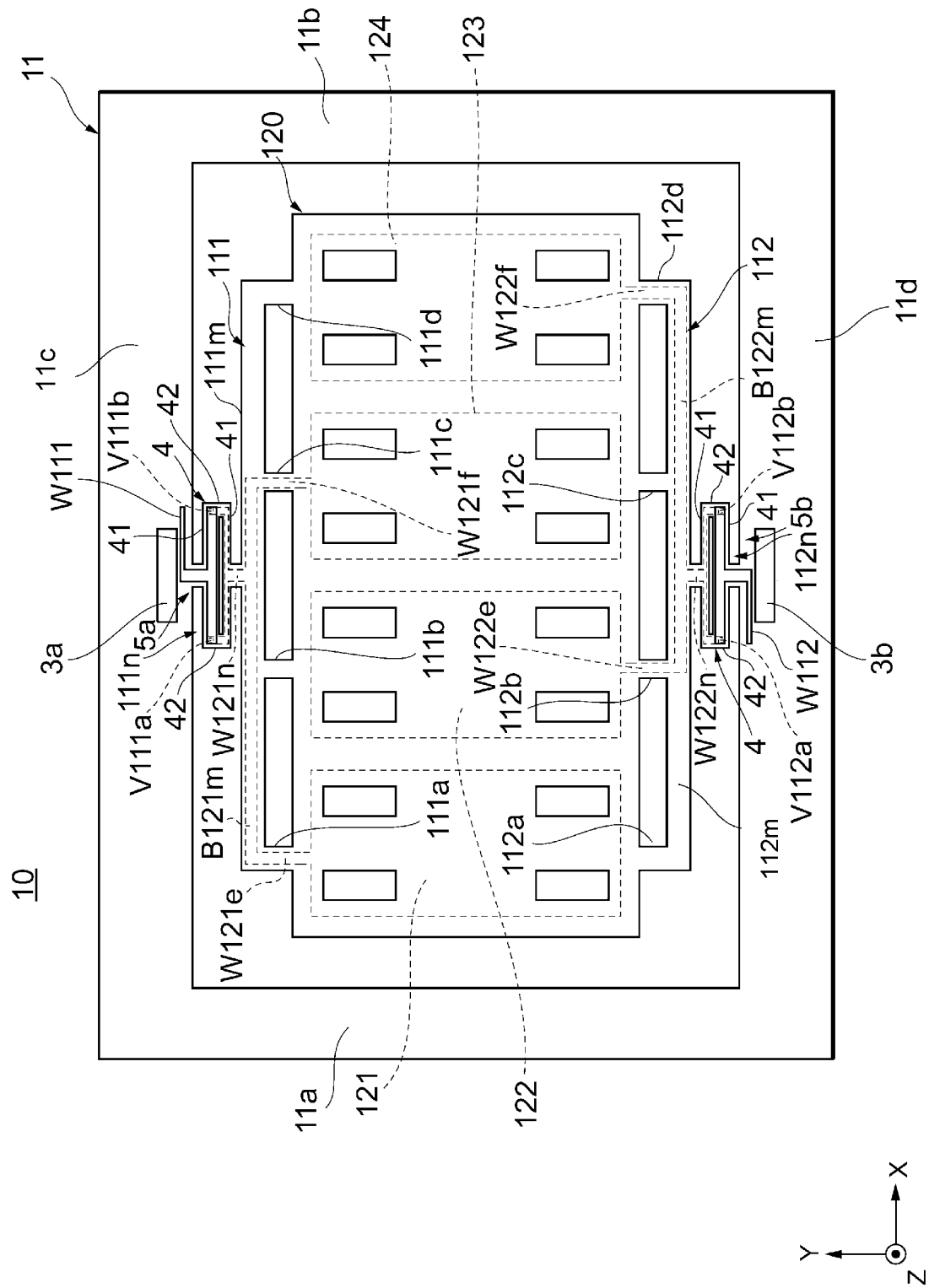
FIG. 8 is a plan view schematically illustrating an example structure of a resonator according to a fourth exemplary embodiment.

FIG. 8 is a plan view schematically illustrating an example structure of a resonator 10 according to this embodiment. The points different from the first embodiment are described below from among components of the resonator 10 according to this embodiment. The resonator 10 according to this embodiment includes, in addition to the configuration described in the first embodiment, busbars B121m and B122m, and wires W121e, W121f, W121n, W122e, W122f, and W122n.

(1. Vibrating Portion 120)

In this embodiment, a vibrating portion 120 includes four upper electrodes 121 to 124. An adjustment film 236 is formed to be exposed in regions corresponding to four corners of each of the upper electrodes 121 to 124. A protection film 235 is formed to be exposed in the other region. Alternatively, the protection film 235 may be formed only in a region covering the upper electrodes 121 to 124.

Further, an electric field is applied to the upper electrodes 121 to 124 of the vibrating portion 120 in a manner that neighboring electrodes have opposite phases. To be specific, an electric field in the same phase is applied to the upper electrode 121 and the upper electrode 123, and an electric field in the counter phase is applied to the upper electrode 122 and the upper electrode 124, the counter phase being opposite to the phase of the upper electrodes 121, 123. A lower electrode 129 is in a floating state according to this embodiment.

The upper electrodes 121 and 123 are connected by the busbar B121m (described later) provided on a holding unit 111. The upper electrodes 122 and 124 are connected by the busbar B122m provided on a holding unit 112.

The other configuration and function of the vibrating portion 120 are similar to those according to the first embodiment.

(2. Holder 11)

The configuration and function of a holder 11 according to this embodiment are similar to the configuration and function of the holder 11 according to the third embodiment.

(3. Holding Units 111 and 112)

In this embodiment, the holding unit 111 connects the frame body 11c with the vibrating portion 120.

The holding unit 111 includes arms 111a, 111b, 111c, 111d, 111m, and 111n.

The arm 111m is provided in a space between the vibrating portion 120 and the frame body 11c, and extends in parallel to the X-axis direction over the upper electrodes 121 to 124, so as to face a long side of the vibrating portion 120.

The arm 111n includes a vibration absorbing portion 4. The arm 111n is provided in parallel to the Y-axis direction, and connects the arm 111m with the frame body 11c. The configuration and function of the vibration absorbing portion 4 are similar to those of the vibration absorbing portions 4a and 4b according to the third embodiment.

The arms 111a to 111d are provided in the space between the vibrating portion 120 and the frame body 11c, and extend in parallel to the Y-axis direction, so as to face a long side of the vibrating portion 120. A lower end of the arm 111a is connected to the long side of the vibrating portion 120 at a portion around the center of an upper short side of the upper electrode 121. An upper end of the arm 111a is connected to a first end portion of the arm 111m.

A lower end of the arm 111d is connected to the long side of the vibrating portion 120 at a portion around the center of an upper short side of the upper electrode 124. An upper end of the arm 111d is connected to a second end portion of the arm 111m. A lower end of the arm 111b is connected to the long side of the vibrating portion 120 at a portion around the center of an upper short side of the upper electrode 122. An upper end of the arm 111b is connected to the arm 111m. A lower end of the arm 111c is connected to the long side of the vibrating portion 120 at a portion around the center of an upper short side of the upper electrode 123. An upper end of the arm 111c is connected to the arm 111m.

The arm 111m, the arm 111n, and the arms 111a to 111d are rectangular plates with long sides each being about 5 μm. In this embodiment, the holding unit 111 has the same number of arms as the number of electrodes of the vibrating portion 120. The holding unit 111 has a left-right symmetrical configuration about the arm 111n in the X-axis direction. Accordingly, a trouble in vibration generated when a non-required vibration mode is coupled to high-order contour vibration can be suppressed.

The configuration and function of the holding unit 112 are similar to the configuration and function of the holding unit 111.

(4. Busbars B121m and B122m)

The busbar B121m is provided in the space between the long side of the vibrating portion 120 and the frame body 11c. To be specific, the busbar B121m is provided on a surface (between the piezoelectric thin film 128 and the protection film 235 in the arm 111m) of the arm 111m, and extends in parallel to the X-axis direction over the upper electrodes 121 to 124 so as to face the long side of the vibrating portion 120. The configuration and function of the busbar B122m are similar to the configuration and function of the busbar B121m.

As described above, in the resonator 10 according to this embodiment, the busbar B121m that connects the upper electrodes 121 and 123 with the same phase provided at the vibrating portion 120 and the busbar B122m that connects the upper electrodes 122 and 124 with the same phase are provided outside the vibrating portion 120. Hence, a gap is generated between the busbar B121m and the upper electrode 122, and a gap is generated between the busbar B122m and the upper electrode 123. The influence of parasitic capacitance can be reduced. Also, since a busbar is no longer required on the vibrating portion 120, the upper electrodes 122 and 123 can be provided up to end portions of the vibrating portion 120.

Further, since the busbars B121m and B122m are provided on the holding units 111 and 112, the number of arms (the arms 111n and 112n in this embodiment) being the connection points between the holding units 111, 112 and the holder 11 can be decreased, and the attenuation of vibration of the vibrating portion 120 can be decreased.

(5. Wires W121e, W121f, W121n, W122e, W122f, and W122n)

The wire W121e is provided on a surface of the arm 111a (between the piezoelectric thin film 128 and the protection film 235 in the arm 111a), extends the upper electrode 121 onto the arm 111a, and connects the upper electrode 121 to the busbar B121m. The wire W121f is provided on a surface of the arm 111c (between the piezoelectric thin film 128 and the protection film 235 in the arm 111c), extends the upper electrode 123, to which the electric field with the same phase as the electric field of the upper electrode 121 is applied, onto the arm 111c, and connects the upper electrode 123 with the busbar B121m.

The wire W121n is connected to the busbar B121m. The wire W121n extends from the connection position with respect to the busbar B121 substantially perpendicularly to the busbar B121m, is branched into two at a portion around the center of the arm 41 (on the vibrating portion 120 side) on the vibration absorbing portion 4, and extends along the arm 41. The wire W121n branched into two bends in a direction perpendicular to the arms 41 along the arm 42 at the connection positions between the arms 41 and the arm 42 (on the vibrating portion 120 side), and extends to upper ends (on the frame body 11c side) of the arms 42.

The wire W122e is provided on a surface of the arm 112a (between the piezoelectric thin film 128 and the protection film 235 in the arm 112a), extends the upper electrode 122 onto the arm 112b, and connects the upper electrode 122 with the busbar B122m. The wire W122f is provided on a surface of the arm 112d (between the piezoelectric thin film 128 and the protection film 235 in the arm 112d), extends the upper electrode 124, to which the electric field with the same phase as the electric field of the upper electrode 122 is applied, onto the arm 112d, and connects the upper electrode 122 to the busbar B122m.

The wire W122n is connected to the busbar B122m. The other configuration and function of the wire W122n are similar to the configuration and function of the wire W121n.

(6. Extended Electrode W111)

The configuration and function of an extended electrode W111 according to this embodiment are similar to the configuration and function of the extended electrode W111A according to the third embodiment.

(7. Extended Electrode W112)

The configuration and function of an extended electrode W112 according to this embodiment are similar to the configuration and function of the extended electrode W112A according to the third embodiment.

Fifth Embodiment

FIG. 9 is a plan view schematically illustrating an example structure of a resonator 10 according to this embodiment. The points different from the first embodiment are described below from among components of the resonator 10 according to this embodiment. The resonator 10 according to this embodiment includes, in addition to the configuration described in the first embodiment, busbars B121m and B122m, and wires W121e, W121f, W121k, W122e, W122f, and W122k.

(1. Vibrating Portion 120)

The configuration and function of the vibrating portion 120 according to this embodiment are similar to the configuration and function of the vibrating portion 120 according to the fourth embodiment.

(2. Holder 11)

The configuration and function of the holder 11 according to this embodiment are similar to the configuration and function of the holder 11 according to the second embodiment.

(3. Holding Units 111 and 112)

In this embodiment, a holding unit 111 connects the frame body 11c with the vibrating portion 120.

The holding unit 111 includes arms 111a, 111b, 111c, 111d, 111m, 111g, and 111f, and a node generating portion 130A.

The node generating portion 130A is provided in a region between a long side (on the frame body 11c side) of the vibrating portion 120 and the frame body 11c of the holder 11. The node generating portion 130A has a side 131a facing a long side of the arm 111m. The side 131a of the node generating portion 130A is connected to the arm 111f. Also, the side 131a is provided at a constant gap with respect to the long side of the arm 111m, substantially in parallel to the long side of the arm 111m. The node generating portion 130A is connected to the arm 111m by the arm 111f, and is connected to the holder 11 by the arm 111g.

The node generating portion 130A has a shape with a width in the X-axis direction decreases from the arm 111f toward the arm 111g. The node generating portion 130A also has a shape axially symmetrical about a perpendicular bisector of the side 131a. The node generating portion 130A has a portion with the maximum width in the X-axis direction on the arm 111f side with respect to the center in the Y-axis direction. In this embodiment, the width in the X-axis direction of the node generating portion 130A becomes the largest at the side 131a, gradually decreases from the arm 111f toward the arm 111g, and becomes the smallest at the connection position between the vertex of the node generating portion 130A and the arm 111g. The width in the X-axis direction of the node generating portion 130A does not have to continuously decrease, and, for example, may decrease stepwise or may partly have a large-width portion, as long as the width gradually decrease as a whole. Also, the peripheral edge of the node generating portion 130A may have projections and depressions without limited to a smooth shape.

In this embodiment, the node generating portion 130A has a semicircular shape having the side 131a as a diameter, and having a radius of about 30 μm. In this case, the center of a circle that forms an arc of the node generating portion 130A is located at the center of the side 131a. Alternatively, the center of the circle that forms the arc of the node generating portion 130A may be located at the center of the arm 111m.

Also, the side 131a does not have to have the straight line, and may have an arcuate shape. In this case, the arm 111f is connected to the vertex of the side 131a. Further in this case, the center of the circle that forms the arc of the side 131a may be located on the arm 111f side or may be located on the arm 111g side. The length of the side 131a is preferably larger than the width in the X-axis direction of the arm 111f, and smaller than the long side of the vibrating portion 120.

The configuration and function of the arms 111a, 111b, 111c, 111d, and 111m according to this embodiment are similar to the configuration and function of the arms 111a, 111b, 111c, 111d, and 111m according to the fourth embodiment.

The arm 111f has a substantially rectangular shape in this embodiment. A first end of the arm 111f is connected to a portion around the center of the long side of the arm 111m. The arm 111f extends from the connection position toward the node generating portion 130A substantially perpendicularly to the long side of the arm 111m. A second end of the arm 111f is connected to the side 131a of the node generating portion 130A. In this embodiment, the width in the X-axis direction of the arm 111f is about 10 μm.

The arm 111g has a substantially rectangular shape. A first end of the arm 111g is connected to a portion with the smallest width in the X-axis direction of the node generating portion 130A. A second end of the arm 111g is connected to a region of the holder 11 facing the node generating portion 130A. The width in the X-axis direction of the arm 111g is preferably equal to or smaller than the width of the arm 111f.

Since the width of the arm 111g is smaller than the width of the arm 111f, the propagation of vibration from the node generating portion 130A to the holder 11 can be reduced. In this embodiment, the width in the X-axis direction of the arm 111g is smaller than the width of the arm 111f, and is about 5 µm.

The node generating portion 130A of the holding unit 111 according to this embodiment has the structure with the width in the X-axis direction gradually decreases from the arm 111f toward the arm 111g. Hence, even if the propagating state of the vibration propagating from the vibrating portion 120 changes, a portion with a small displacement caused by the vibration is formed next to a portion with a large displacement caused by the vibration in the node generating portion 130A. Accordingly, the node generating portion 130A can form a node of the vibration on the node generating portion 130A by adjusting the displacement portion for the vibration leaking from the vibrating portion 120. The node generating portion 130A is connected to the arm 111g at this formed node, and hence the propagation of vibration from the vibrating portion 120 to the holder 11 can be reduced. As the result, anchor loss of the resonator 10 can be decreased, and Q-value can be improved.

On the other hand, in this embodiment, the holding unit 112 connects the frame body 11d with the vibrating portion 120. The holding unit 112 includes arms 112a, 112b, 112c, 112d, 112m, 112g, and 112f, and a node generating portion 130B.

The configuration and function of the arm 112f are similar to the configuration and function of the arm 111f. The configuration and function of the arm 112g are similar to the configuration and function of the arm 111g. Further, the configuration and function of the node generating portion 130B are similar to the configuration and function of the node generating portion 130B.

The configuration and function of the arms 112a, 112b, 112c, 112d, and 112m according to this embodiment are similar to the configuration and function of the arms 112a, 112b, 112c, 112d, and 112m according to the fourth embodiment.

(4. Busbars B121m and B122m)

The configuration and function of the busbars B121m and B122m according to this embodiment are similar to the configuration and function of the busbars B121m and B122m according to the fourth embodiment.

(5. Wires W121e, W121f, W121k, W122e, W122f, and W122k)

The configuration and function of the wires W121e, W121f, W122e, and W122f according to this embodiment are similar to the configuration and function of the wires W121e, W121f, W122e, and W122f according to the fourth embodiment.

The wire W121k is connected to the busbar B121m, and is formed to extend from the arm 111f to the arm 111g along the perpendicular bisector at the side 131a of the node generating portion 130A. The configuration of the wire W122k is similar to the configuration of the wire W121k.

(6. Extended Electrode W111)

An extended electrode W111 according to this embodiment extends from the frame body 11c in a direction substantially perpendicular to the frame body 11c, and is formed to extend from the arm 111g to the side 131a of the node generating portion 130A. The extended electrode W111 is connected to the wire W121k at a position around the connection position between the side 131a and the arm 111f. The extended electrode W111 and the wire W121k are connected to each other through a via V111 formed at a position around the connection position between the side 131a and the arm 111f so as to penetrate through the protection film 235.

Alternatively, the extended electrode W111 may be formed to extend from the frame body 11c to a position around the connection position between the node generating portion 130A and the arm 111g. In this case, the extended electrode W111 and the wire W121k are connected to each other through the via V111 formed at a position around the connection position between the node generating portion 130A and the arm 111g so as to penetrate through the protection film 235.

Alternatively, the extended electrode W111 may be formed to extend from the frame body 11c to a position around the connection position between the arm 111f and the arm 111m. In this case, the extended electrode W111 and the wire W121k are connected to each other through the via V111 formed at a position around the connection position between the arm 111f and the arm 111m so as to penetrate through the protection film 235.

The other configuration and function of the extended electrode W111 are similar to those of the first embodiment.

(7. Extended Electrode W112)

The configuration and function of an extended electrode W112 according to this embodiment are similar to the configuration and function of the extended electrode W111 according to this embodiment.

The above-described embodiments are provided for easier understanding of the present disclosure and are not for interpreting the present invention in a limited manner. The exemplary embodiments may be modified and improved without departing from the idea, and the present invention includes the equivalents. That is, the present invention includes, within its scope, a configuration obtained by those skilled in the art properly adding a change in design to any of the aforementioned embodiments as long as the resultant has the characteristics of the present invention. For example, respective elements, their arrangement, materials, conditions, shapes, sizes, and so forth in any of the aforementioned embodiments are not limited to those exemplified, and may be properly changed. The embodiments are merely examples, and the respective elements included in different ones of the aforementioned embodiments may be combined as far as technically possible. The present invention includes the combination as long as the combination has the characteristics of the present invention.

REFERENCE SIGNS LIST 10 resonator
11 holder
11a to 11d frame body
111 holding unit
111a, 111b, and 111n arm
112 holding unit
112a, 112b, and 112n arm
120 vibrating portion
121 to 125 upper electrode
128 piezoelectric thin film
129 lower electrode
130 Si substrate
235 protection film
236 adjustment film
B121 and B122 busbar
W111 and W112 extended electrode
V111, V111a, and V111b via
V112, V112a, and V112b via

The invention claimed is:

1. A resonator, comprising:
a vibrating portion including at least one first electrode, a second electrode, and a piezoelectric film;
a frame that surrounds the vibrating portion;
a pair of holding units respectively connecting opposing sides of the vibrating portion to the frame; and
at least one extended electrode extending from the frame to one holding unit of the pair of holding units,
wherein the at least one first electrode extends from the vibration portion to the one holding unit and is coupled to the extended electrode on the one holding unit, and
wherein the at least one extended electrode has an electrical resistance value per unit area that is smaller than an electrical resistance value per unit area of the at least one first electrode extended from the vibration portion to the one holding unit.

2. The resonator according to claim 1, wherein the one holding unit further includes a protection film of an insulator disposed on the at least one first electrode.

3. The resonator according to claim 2, wherein the at least one extended electrode is connected to the at least one first electrode through a via extending through the protection film.

4. The resonator according to claim 1,
wherein the second electrode extends from the vibration portion to a second holding unit of the pair of holding units, and
wherein the at least one extended electrode comprises a pair of extended electrodes connected to the at least one first electrode or the second electrode, respectively.

5. The resonator according to claim 1, wherein each holding unit of the pair of holding units includes:
a first arm extending in a direction substantially parallel to a respective side of the vibrating portion, and
a second arm extending in a direction substantially perpendicular to the first arm and connecting the first arm with the vibrating portion,
wherein the at least one extended electrode is connected to the respective at least one first or second electrode through a via at a connection point between the first arm and the second arm of the respective holding unit.

6. The resonator according to claim 1,
wherein at least one of the pair of holding unit includes a vibration absorbing portion having a pair of first arms extending substantially parallel to the respective side of the vibrating portion, and a pair of second arms extending in a direction substantially perpendicular to the pair of first arms, such that both ends of the pair of first arms are connected to both ends of the pair of second arms respectively, and
wherein the at least one extended electrode is connected to the at least one first electrode through a pair of vias at respective connection points between the pair of first arms and the pair of second arms.

7. The resonator according to claim 1, wherein the at least one first electrode and the second electrode are disposed on opposing surfaces of the piezoelectric film of the vibrating portion.

8. The resonator according to claim 1, wherein the at least one first electrode comprises a plurality of first electrodes disposed on the piezoelectric film with a first portion of the plurality of first electrodes having an opposite phase than a second portion of the plurality of first electrodes.

9. The resonator according to claim 8, wherein the second electrode is a floating electrode and is disposed on a surface of the piezoelectric film opposing the plurality of first electrodes.

10. The resonator according to claim 1, wherein the at least one extended electrode has a greater thickness than the at least one first electrode, such that the at least one extended electrode has the electrical resistance value per unit area smaller than the electrical resistance value per unit area of the at least one first electrode.

11. A resonator, comprising:
a vibrating portion including a piezoelectric film with a first electrode disposed thereon;
a frame surrounding the vibrating portion to secure the vibration portion therein;
at least one holding unit that couples the vibrating portion to the frame; and
at least one extended electrode extending from the frame to the at least one holding unit,
wherein the first electrode extends from the vibration portion to the at least one holding unit and is coupled to the at least one extended electrode, and
wherein the at least one extended electrode has a greater thickness than the first electrode, such that the at least one extended electrode has an electrical resistance value per unit area smaller than an electrical resistance value per unit area of the first electrode.

12. The resonator according to claim 11, wherein the at least one holding unit includes a protection film disposed on the first electrode.

13. The resonator according to claim 12, wherein the at least one extended electrode is connected to the first electrode through a via extending through the protection film.

14. The resonator according to claim 11, further comprising:
a second electrode disposed on a side of the piezoelectric film opposite the first electrode, the second electrode extending from the vibration portion to another holding unit,
wherein another extended electrode is connected to the second electrode.

15. The resonator according to claim 11, wherein the at least one holding unit includes:
a first arm extending in a direction substantially parallel to a side of the vibrating portion, and
a second arm extending in a direction substantially perpendicular to the first arm and connecting the first arm with the vibrating portion,
wherein the at least one extended electrode is connected to the first electrode through a via at a connection point between the first arm and the second arm of the respective holding unit.

16. The resonator according to claim 11,
wherein the first electrode comprises a plurality of first electrodes disposed on the piezoelectric film with a first portion of the plurality of first electrodes having an opposite phase than a second portion of the plurality of first electrodes, and
wherein a floating electrode is disposed on a surface of the piezoelectric film opposing the plurality of first electrodes.

17. A resonator, comprising:
a vibrating portion including a piezoelectric film with a first electrode disposed thereon;
a frame surrounding the vibrating portion to secure the vibration portion therein;

a pair of holding arms that connect respective sides of the vibrating portion to the frame, the pair of holding arms having a narrower width that the respective sides of the vibrating portion;

a protection film disposed on the first electrode, with the first electrode extending from the vibration portion to at least one holding unit of the pair of holding units; and a connection electrode extending from the frame to the at least one holding unit and electrically coupled to the first electrode by a via extending through the protection film, wherein the connection electrode has a greater thickness than the first electrode.

18. The resonator according to claim 17, wherein the greater thickness of the connection electrode provides an electrical resistance value per unit area that is smaller than an electrical resistance value per unit area of the first electrode.

19. The resonator according to claim 17, the at least one holding unit includes:

a first arm extending in a direction substantially parallel to a respective side of the vibrating portion, and at least one second arm extending in a direction substantially perpendicular to the first arm and connecting the first arm with the vibrating portion, wherein the connection electrode is connected to the first electrode through a via at a connection point between the first arm and the at least one second arm of the respective holding unit.

20. The resonator according to claim 17, wherein the first electrode comprises a plurality of first electrodes disposed on the piezoelectric film with a first portion of the plurality of first electrodes having an opposite phase than a second portion of the plurality of first electrodes, and wherein a floating electrode is disposed on a surface of the piezoelectric film opposing the plurality of first electrodes.

* * * * *